US006756834B1

(12) United States Patent
Tong et al.

(10) Patent No.: US 6,756,834 B1
(45) Date of Patent: Jun. 29, 2004

(54) DIRECT POWER-TO-GROUND ESD PROTECTION WITH AN ELECTROSTATIC COMMON-DISCHARGE LINE

(75) Inventors: Paul C. F. Tong, San Jose, CA (US); Siu-Weng Simon Wong, Palo Alto, CA (US); Ping Ping Xu, San Jose, CA (US); Zhi Qing Liu, San Jose, CA (US); Wensong Chen, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/249,670

(22) Filed: Apr. 29, 2003

(51) Int. Cl.[7] ................................................ H03K 5/08
(52) U.S. Cl. ........................ 327/309; 327/310; 327/318; 327/319; 327/324; 361/91.1; 361/111
(58) Field of Search ................................ 327/309, 310, 327/313, 314, 318, 319, 320, 324, 327, 328; 361/90, 91.1, 91.5, 111

(56) References Cited

U.S. PATENT DOCUMENTS

| | | | | |
|---|---|---|---|---|
| 5,345,356 A | * | 9/1994 | Pianka ........................ 361/56 |
| 5,521,783 A | | 5/1996 | Wolfe et al. ................. 361/56 |
| 5,559,659 A | * | 9/1996 | Strauss ........................ 361/56 |
| 5,644,460 A | | 7/1997 | Clukey ........................ 361/56 |
| 5,706,156 A | | 1/1998 | Narita ......................... 361/56 |
| 5,721,656 A | | 2/1998 | Wu et al. ..................... 361/56 |
| 5,751,051 A | * | 5/1998 | Hayano ...................... 257/546 |
| 5,875,086 A | | 2/1999 | Narita ......................... 361/56 |
| 5,923,079 A | | 7/1999 | Narita ......................... 257/577 |
| 5,953,191 A | | 9/1999 | Narita ......................... 361/56 |
| 5,982,599 A | | 11/1999 | Ma et al. ..................... 361/111 |
| 6,072,350 A | | 6/2000 | Fukuda ....................... 327/313 |
| 6,118,640 A | | 9/2000 | Kwong ........................ 361/56 |
| 6,144,542 A | | 11/2000 | Ker et al. .................... 361/111 |
| 6,157,203 A | * | 12/2000 | Takahashi .................... 326/21 |
| 6,169,310 B1 | | 1/2001 | Kalnitsky et al. ........... 257/355 |
| 6,249,414 B1 | * | 6/2001 | Lee et al. .................... 361/111 |
| 6,292,343 B1 | | 9/2001 | Pequignot et al. .......... 361/111 |
| 6,411,480 B1 | * | 6/2002 | Gauthier et al. .............. 361/56 |
| 6,411,485 B1 | | 6/2002 | Chen et al. .................. 361/111 |
| 6,424,013 B1 | * | 7/2002 | Steinhoff et al. ........... 257/355 |
| 6,650,165 B1 | * | 11/2003 | Mallikarjunaswamy ..... 327/310 |
| 2002/0021538 A1 | | 2/2002 | Chen et al. ................... 361/56 |

OTHER PUBLICATIONS

Narita et al.; "A Novel On–Chip Electronic Discharge (ESD) Protection with Common Discharge Line for High–Speed CMOS LSI's", IEEE Trans. on Electron Devices, vol. 44, No. 7, Jul. 1997, pp. 1124–1130.

* cited by examiner

Primary Examiner—Timothy P. Callahan
Assistant Examiner—An T. Luu
(74) Attorney, Agent, or Firm—Stuart T. Auvinen

(57) ABSTRACT

ESD protection is provided by local ESD-protection devices between each pad and a common-discharge line (CDL). Each ESD-protection device has p-well or p-substrate taps to a local ground rather than to the CDL, reducing noise coupling from the I/O's through the CDL. Another ESD clamp that bypasses the CDL is provided between each pair of internal power and ground buses. Better protection of core circuits during power-to-ground ESD events is provided by bypassing the CDL since only one ESD clamp rather than two ESD-protection devices must turn on. The ESD clamps and ESD-protection devices can be gate-coupled n-channel transistors with coupling capacitors between the pad and the transistor gate. Devices can also be substrate-triggered transistors or active ESD clamps that include an inverter between a coupling capacitor to the CDL and the n-channel transistor gate.

20 Claims, 6 Drawing Sheets

DIRECT POWER-TO-GROUND ESD PROTECTION WITH AN ELECTROSTATIC COMMON-DISCHARGE LINE

BACKGROUND OF INVENTION

This Invention relates to electro-static-discharge (ESD) protection devices, and more particularly to ESD protection using a common-discharge line (CDL).

Mixed-signal integrated circuit (IC) chips often have multiple power and ground supply pins and internal busses. Basic ESD-protection devices and structures are normally placed on each input/output pin and provide protection for an ESD zap between the pin and one of the power/ground buses. Protection for zaps between the pin and the other ground and power buses is minimal. Pin-to-pin ESD protection can also be inadequate.

More recently, ESD protection structures or shorting devices have been added between each possible pair of the multiple power and ground buses. These devices extend ESD protection regardless to which ground or power supply the local pin's ESD structure is attached to.

Another advance is an additional internal bus used for ESD protection. This internal bus is known as a common discharge line (CDL) and is not one of the power or ground buses. The CDL provides a low-impedance and symmetric path for ESD currents even when ESD pulses are applied across two I/O pins. However, buffer circuits in the core, such as large inverters with large widths and minimum layout rules between a power bus and a ground bus can be easily triggered on during a VCC-to-VSS zapping configuration, resulting in them carrying too much of the ESD current and being damaged.

Another problem with CDL schemes using grounded-gate NMOS protection devices (with both source and body tied together) is that noise from I/O devices can be coupled through the CDL to core circuits. Local p-well or p-substrate taps near the grounded-gate ESD-protection devices can couple current to the CDL and then to core circuits.

What is desired is an ESD-protection scheme that has the versatility of a CDL structure, yet provides better protection for power-to-ground ESD events. A more noise-isolating CDL scheme is desired.

DETAILED DESCRIPTION

The present invention relates to an improvement in ESD protection. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
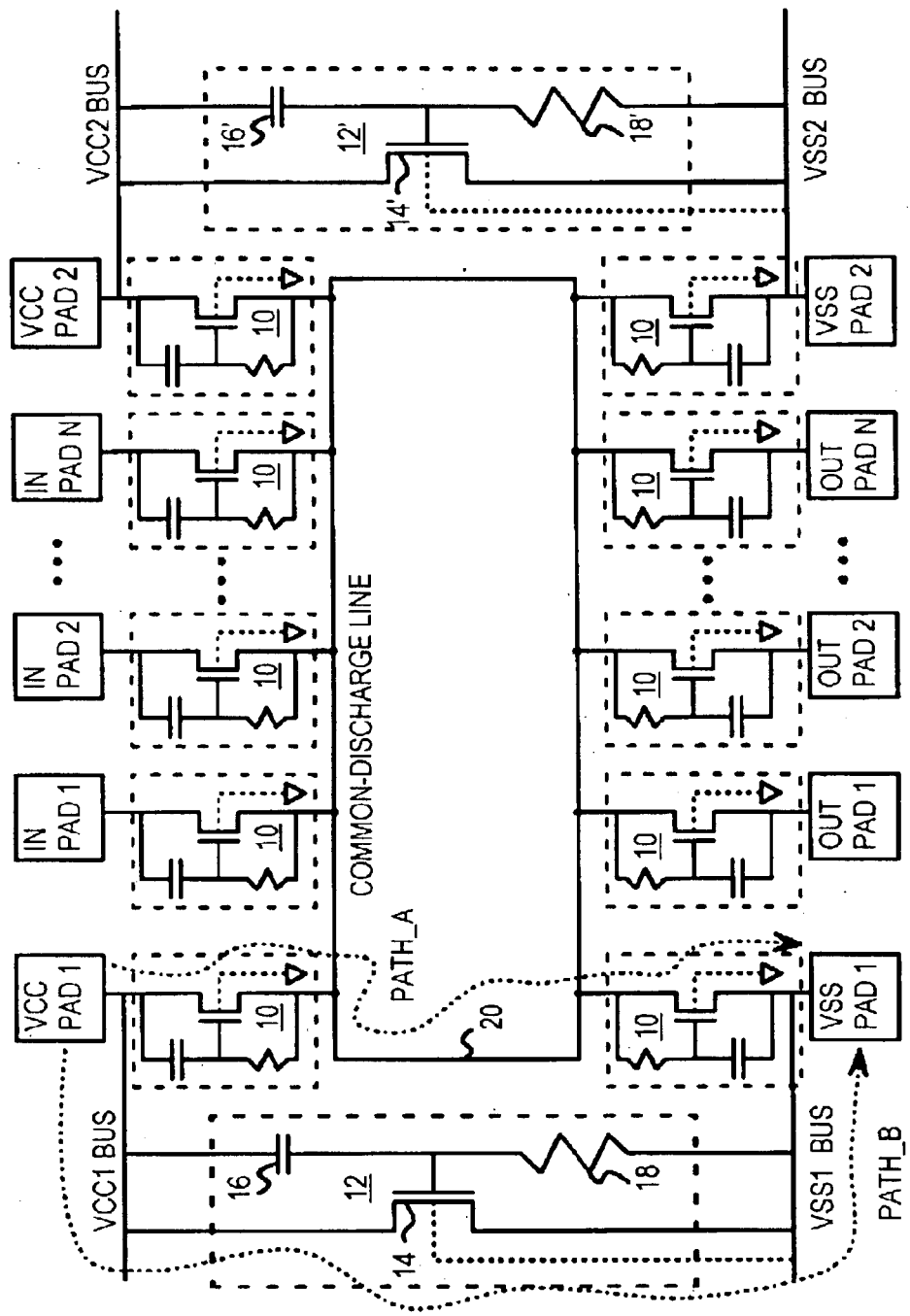
FIG. 1 is a block diagram of common-discharge-line ESD-protection with additional ESD clamps between internal power and ground buses.

FIG. 1 is a block diagram of common-discharge-line ESD-protection with additional ESD clamps between internal power and ground buses. ESD protection devices 10 are connected between pads and common-discharge line CDL 20. Each ESD protection device 10 has an n-channel transistor with a channel connected between a pad and CDL 20. The gate of the n-channel transistor is driven high during an ESD event by a coupling capacitor between the transistor gate and the pad. A large-value resistor between the transistor gate and CDL 20 discharges the gate after a period of time once the ESD event ends.

An ESD protection device 10 is connected to each input pad, each output pad, and bi-directional I/O pads (not shown), and power pads and ground pads. ESD zaps between any pair of pads activates one ESD protection device 10 for each pad, allowing the ESD pulse to be discharged through CDL 20. For example, when an ESD pulse is applied between VCC pad 1 and VSS pad 1, ESD protection device 10 attached to VCC pad 1 is activated, turning on its n-channel transistor temporarily before going into the snapback mode and discharging the ESD pulse from VCC pad 1 to CDL 20. ESD protection device 10 on VSS pad 1 also turns because its Vgs>Vt, discharging the ESD current from CDL 20 to VSS pad 1, which is attached to the ESD ground. This is shown as path A in FIG. 1.

Additional ESD protection is provided between internal power and ground buses. This additional protection can prevent damage to core transistors coupled between the power and ground buses. For example, ESD clamp 12 is connected between the VCC1 bus (connected to VCC pad 1) and the VSS1 bus (connected to VSS pad 1).

ESD clamp 12 contains n-channel transistor 14, which has its source and substrate connected to VSS1, and its drain connected to VCC1. The gate of transistor 14 is driven high during a positive ESD event on VCC1 by coupling capacitor 16 between its gate and VCC1. Resistor 18 discharges the gate to VSS1. Resistor 18 has a sufficiently large resistance value so that transistor 14 remains on long enough to discharge most of the ESD pulse. This is shown as path B in FIG. 1.

Since path A contains two n-channel transistors in series, while path B contains only one transistor 14, most of the ESD current should pass through path B, as ESD clamp 12 should turn on before both of ESD protection devices 10. The earlier turn-on of ESD clamp 12 provides better ESD protection between VCC pad 1 and VSS pad 1, better protecting and core transistors between VCC1 and VSS1.

A similar ESD clamp 12' is provided between VCC pad 2 (internal VCC2 bus) and VSS pad 2 (internal VSS2 bus). Other ESD clamps 12 can be connected between other pairs of local power and ground buses. An ESD clamp 12 is provided between pairs of power and ground buses that have transistors connected between them, not for all possible combinations of power and ground buses. For example, ESD clamp 12 can be provided between power and ground buses to an internal logic block and another ESD clamp 12 provided to an internal analog block, but an ESD clamp 12 does not need to be provided between the analog power supply and the logic ground if there are no transistors between the analog power and the logic ground.

Rather than connect the p-substrates of the n-channel transistors in ESD protection devices 10 to CDL 20, p-taps near the n-channel transistors are connected to local ground lines. Using local-ground p-taps rather than p-taps CDL 20 reduces noise coupling through CDL 20. Thus coupling of I/O noise through CDL 20 is reduced through the use of local-ground p-taps.

Figure 2:
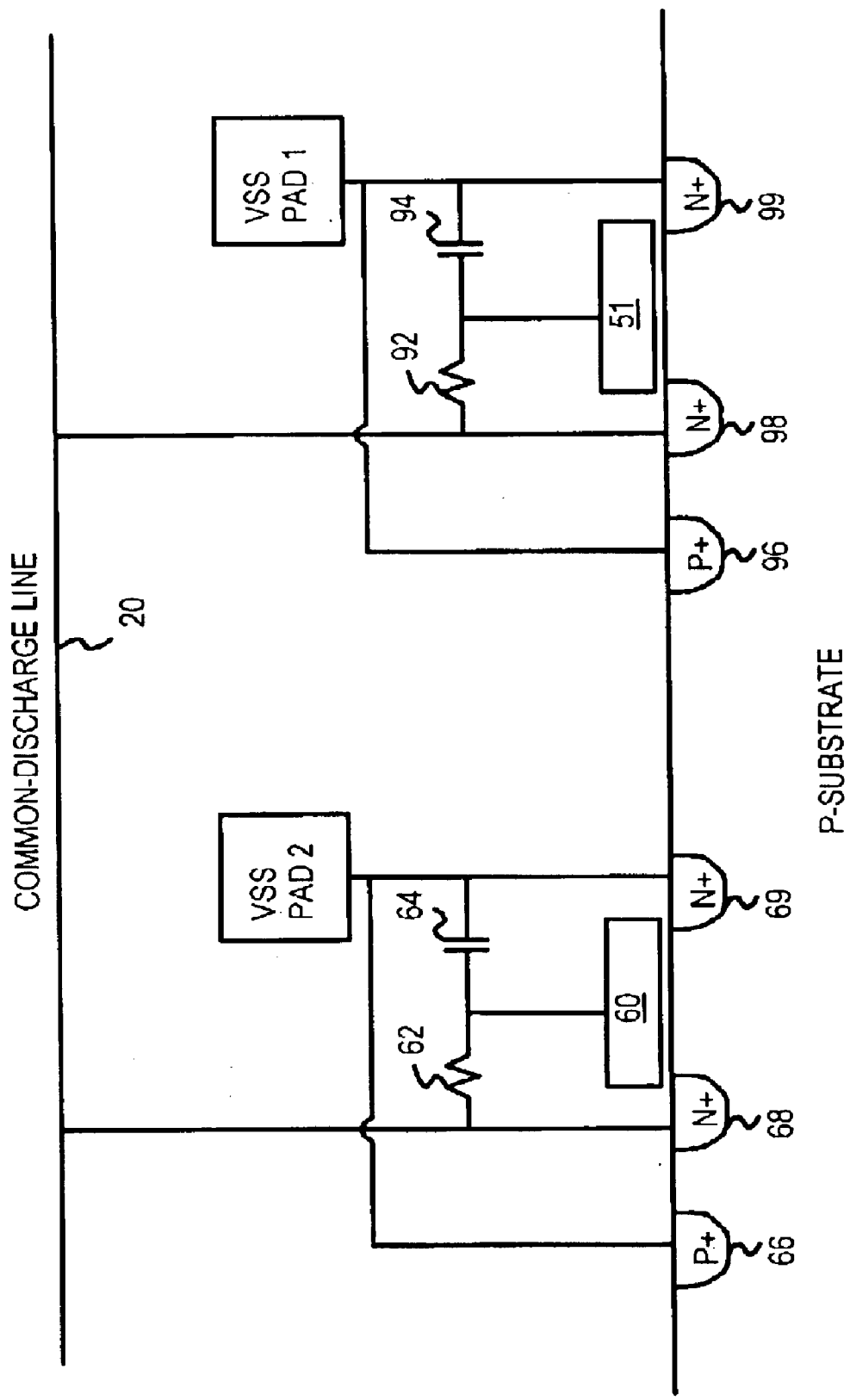
FIG. 2 is a partial cross-section showing a pair of ESD protection devices coupled to a common-discharge line.

FIG. 2 is a partial cross-section showing a pair of ESD protection devices coupled to a common-discharge line. Coupling capacitor 64 coupled a portion of a positive ESD pulse applied to VSS pad 2 to gate 60 of an n-channel transistor in the ESD protection device for VSS pad 2. The transistor turns on temporarily before going into snapback mode, conducting current from N+ drain 69 connected to VSS pad 2 to N+ source 68 connected to CDL 20. Eventually resistor 62 discharges gate 60 to CDL 20, turning off the transistor.

The rising voltage of CDL 20 is applied to N+ drain 98. N+ source 99 is connected to VSS pad 1, which is at the ESD ground. Since gate 51 is also connected to N+ drain 98 through resistor 92, the potential on gate 51 is expected to increase, turning on the transistor because Vgs >Vt, thus, discharging CDL 20 to the ESD ground on VSS pad 1.

Rather than connect the p-substrates to CDL 20, the p-taps near gates 51, 60 are connected to local VSS lines. P-tap 66 near gate 60 is connected to the nearest VSS pad, VSS pad 2. Likewise, p-tap 96 near gate 51 is connected to its nearest VSS pad, VSS pad 1. When the ESD protection device is for an I/O pad, the local p-tap is connected to the nearest VSS pad, not to the I/O pad or to CDL 20. The local-ground p-taps reduce noise coupling since they are not connected to CDL 20. Only N+ source 68 and N+ drain 98 are connected to CDL 20.

Figure 3:
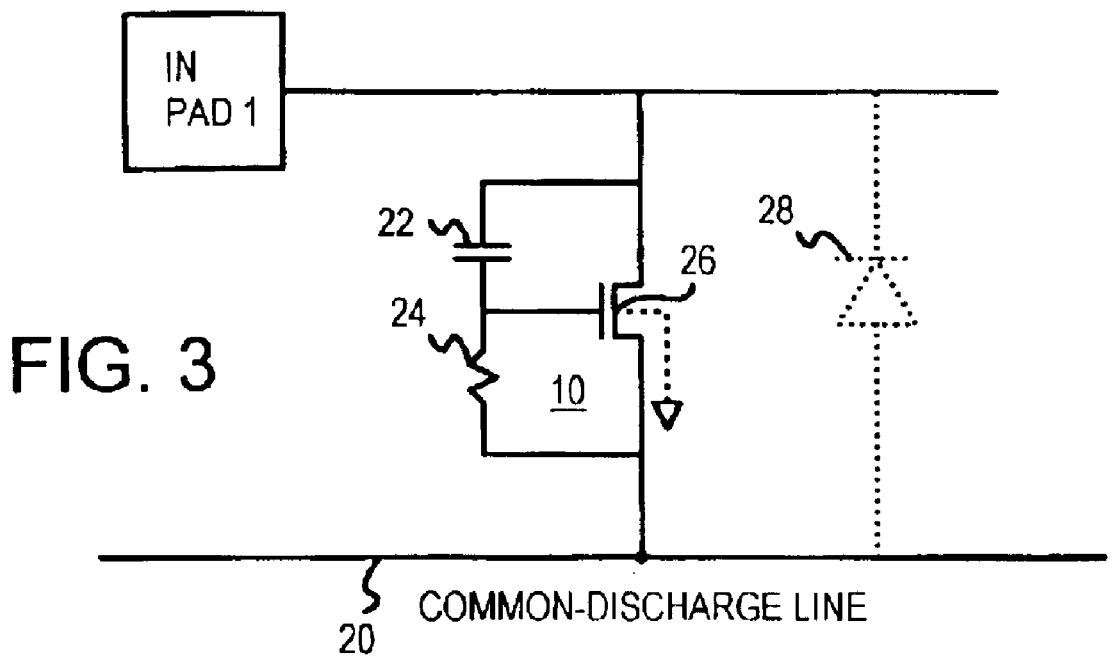
FIG. 3 shows an ESD protection device between an I/O pad and the CDL.

FIG. 3 shows an ESD protection device between an I/O pad and the CDL. ESD protection device 10 is a gate-coupled NMOS protection device. Coupling capacitor 22 couples a portion of a positive ESD voltage to the gate of n-channel transistor 26, turning it on temporarily before going into snapback mode. The parasitic lateral NPN associated with transistor 26 then discharges the ESD current from input pad 1 to CDL 20. Resistor 24 eventually discharges the gate of transistor 26 to CDL 20, turning transistor 26 off. Parasitic diode 28 is reverse biased under the positive input pad 1 with respect to any other pad zap configuration, but this parasitic diode will operate in the forward conduction mode under the negative input pad 1 with respect to any other pad zap configuration. Parasitic diode 28 is composed of the N+ junction (drain of transistor 26) and the common p-substrate.

The p-substrate under transistor 26 is connected to a local ground through a p-tap to a nearby ground bus. This prevents substrate coupling of noise from the I/O pads through CDL 20.

Figure 4:
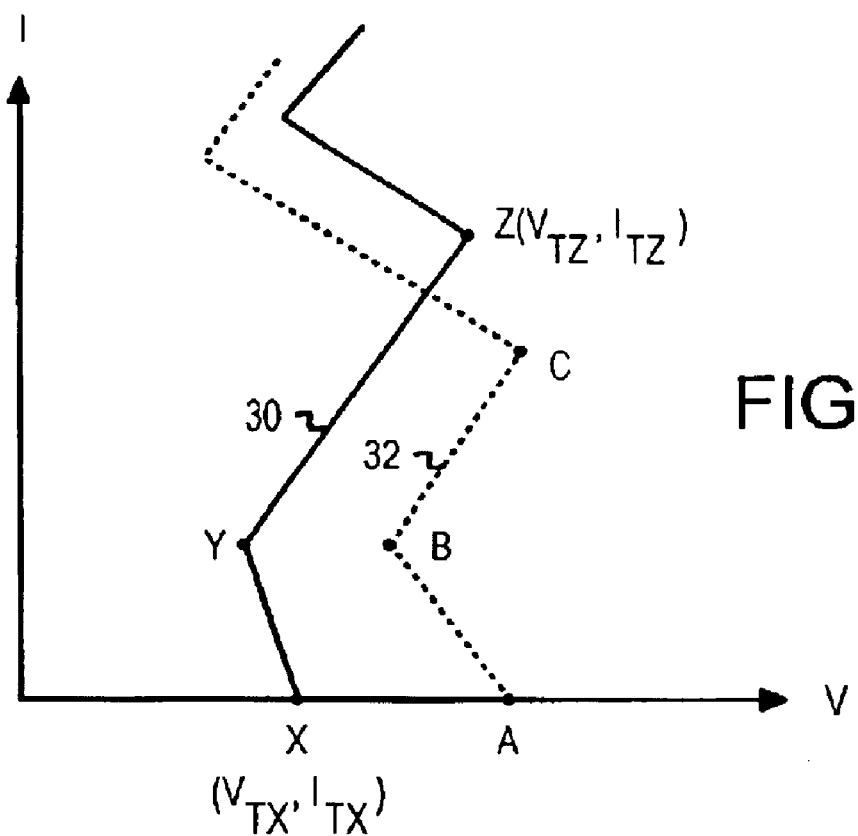
FIG. 4 is a current-voltage plot of the gate-coupled ESD protection device of FIG. 3.

FIG. 4 is a current-voltage plot of the gate-coupled ESD protection device of FIG. 3. Transistor 26 of FIG. 3 has the I-V characteristic of curve 30. When the positive ESD pulse is applied to the pad and drain of transistor 26, the coupling capacitor quickly raises the gate voltage until the trigger voltage Vtx is reached at point X. Then transistor 26 is triggered and turns on, conducting current Itx.

Eventually transistor 26 goes into snapback at point Y. A second breakdown region is entered beyond point Z, at voltage Vtz. The holding current Itz is the highest current transistor 26 can safely carry before it goes into secondary breakdown wherein permanent destruction of transistor 26 can occur due to thermal runaway.

The initial triggering voltage Vtz is lower than that for point A of curve 32, which is for a simple grounded-gate transistor as the ESD protection device. Using the coupling capacitor turns on the transistor at a lower voltage than when the gate is grounded. The lower trigger voltage provided better protection to core circuits because the regular N+/P junction breakdown voltage is much higher. For ESD currents below the second breakdown regions of point C, a lower voltage is required for the capacitive-coupled transistor of curve 30, than for the grounded-gate transistor of curve 32. Damage can occur to the ESD device at the higher currents of the second breakdown region above points C, Z.

Figure 5:
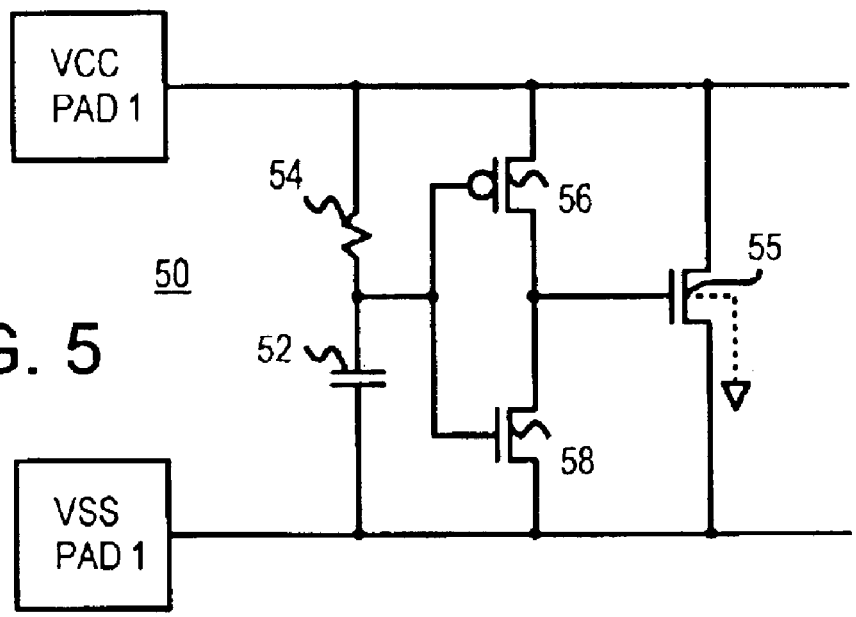
FIG. 5 shows an alternate ESD protection device using an active clamp.

FIG. 5 shows an alternate ESD protection device using an active clamp. Active-clamp device 50 is preferably used between power and ground pads to provide extra ESD protection to core circuits connected between the power and ground pads.

An inverter of p-channel transistor 56 and n-channel transistor 58 is placed between coupling capacitor 52 and shunt n-channel transistor 55. Resistor 54 keeps the gates of transistors 56, 58 tied to power VCC pad 1, which keeps n-channel transistor 58 on, driving ground to the gate of shunt n-channel transistor 55, keeping it off during normal operation.

When a positive ESD pulse is applied between VCC1 and VSS1, p-channel transistor 56 is initially turned on because |Vgs|>|Vtp| and this will connect VCC1 to the gate of shunt n-channel transistor 55. Transistor 55 turns on, conducting current from VCC1 to VSS1. As soon as the coupling capacitor is charged-up, the gates of transistors 56, 58 are pulled high. P-channel transistor 56 turns off, but n-channel transistor 58 turns on, pulling the gate of transistor 55 low, shutting off shunting transistor 55. The time constant provided by resistor 54 and coupling capacitor 52 determines how long shunting n-channel transistor 55 remains turned on.

Active-clamp device 50 has a very low trigger voltage. The trigger voltage is near the threshold voltage of shunt n-channel transistor 55, usually less than one volt above ground. The p-tap for shunt n-channel transistor 55 and its source are both preferred to be connected together (to avoid the threshold increase due to body effect) to a local ground or to VSS1.

Figure 6:
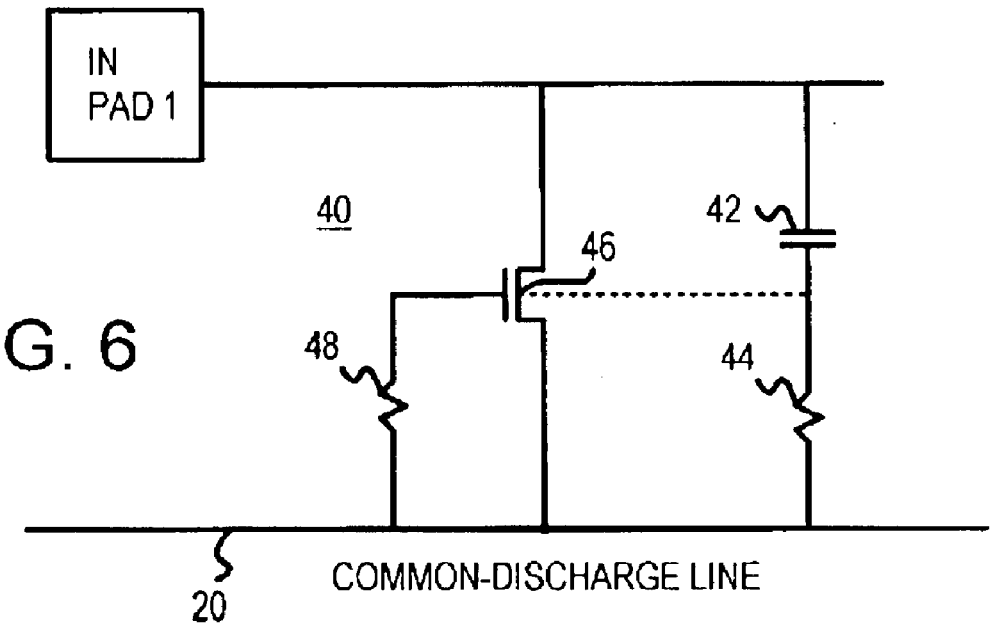
FIG. 6 shows an alternate ESD protection device using a substrate-triggered NMOS clamp.

FIG. 6 shows an alternate ESD protection device using a substrate-triggered NMOS clamp. Substrate-triggered clamp 40 can be used in place of ESD protection device 10 (FIG. 1) for any pad. During an ESD event, current is shunted from input pad 1 to CDL 20 through n-channel transistor 46. The gate of n-channel transistor 46 is connected to CDL 20 through resistor 48.

The p-type substrate under transistor 46 is pulsed high when a positive ESD pulse is applied to pad 1. This holes injection into the p-substrate (or body) of n-channel transistor 46 lowers its snapback voltage. The ESD current is then conducted through the parasitic lateral NPN associated with transistor 46. The drain of transistor 46 forms the collector, and its source forms the emitter. The body (or P-substrate) forms the base on this parasitic lateral NPN.

Resistor 44 connects the p-taps of transistor 46 to CDL 20, discharging capacitor 42 after the ESD event.

Figure 7:
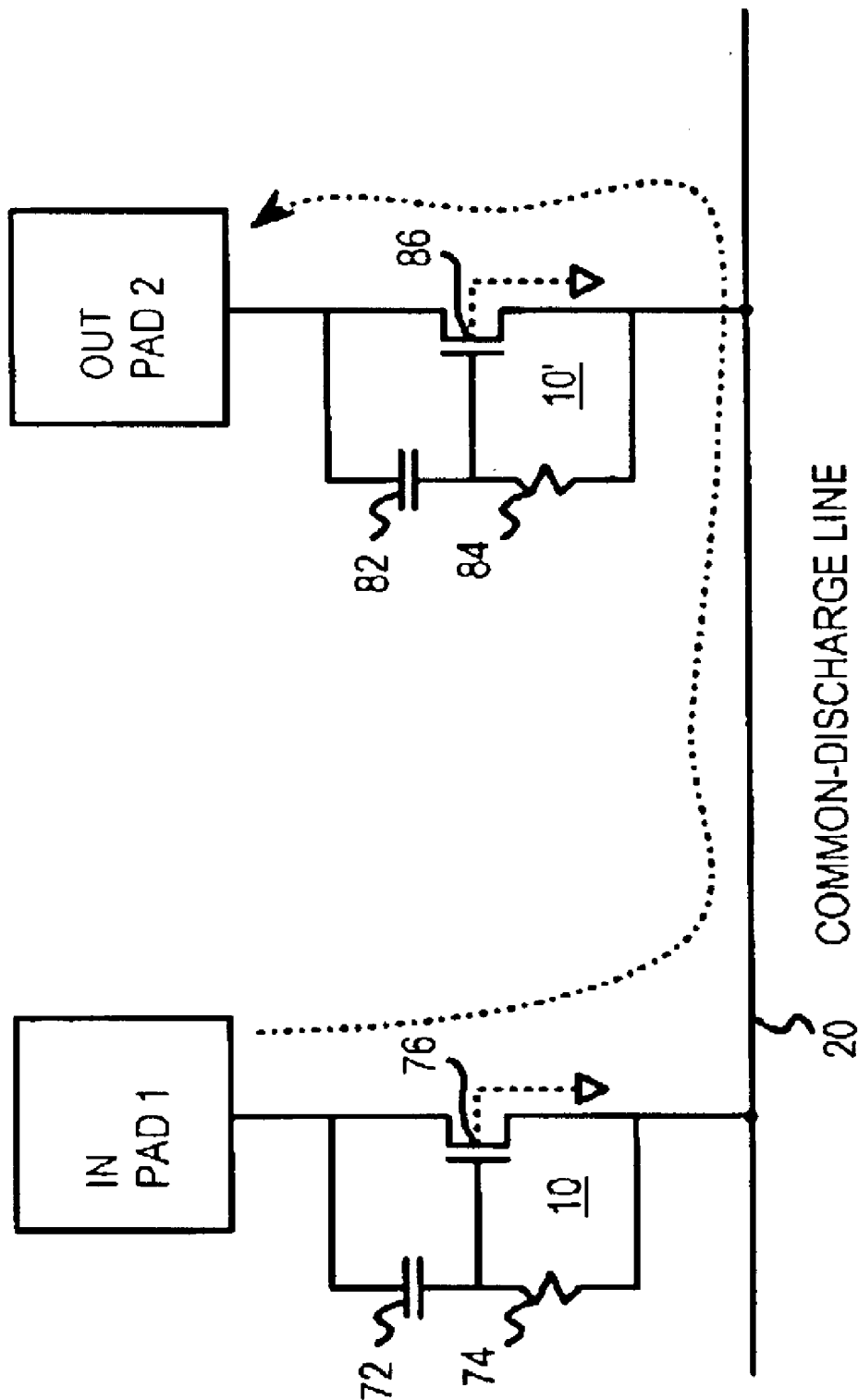
FIG. 7 shows conduction of ESD current between two I/O pads using the CDL

FIG. 7 shows conduction of ESD current between two I/O pads using the CDL. An ESD pulse is applied between input pad 1 and output pad 2. ESD protection device 10 turns on temporarily before going into snapback mode, conducting ESD current through the parasitic lateral NPN associated with transistor 76 to CDL 20. Coupling capacitor 72 drives high the gate of transistor 76, while resistor 74 slowly discharges the gate.

Since the gate of transistor 86 in ESD protection device 10' is connected to the CDL 20 through resistor 84, the gate of transistor 86 is pulled high, Vgs>Vt effectively shunting the current from CDL 20 to output pad 2. Capacitor 82 is not used in this zap configuration.

P-taps for transistors 76, 86 are connected to local ground lines. The same ground line may connect to both transistors 76, 86, or different ground lines may be used, depending on the physical locations of pads 1 and 2.

Figure 8:
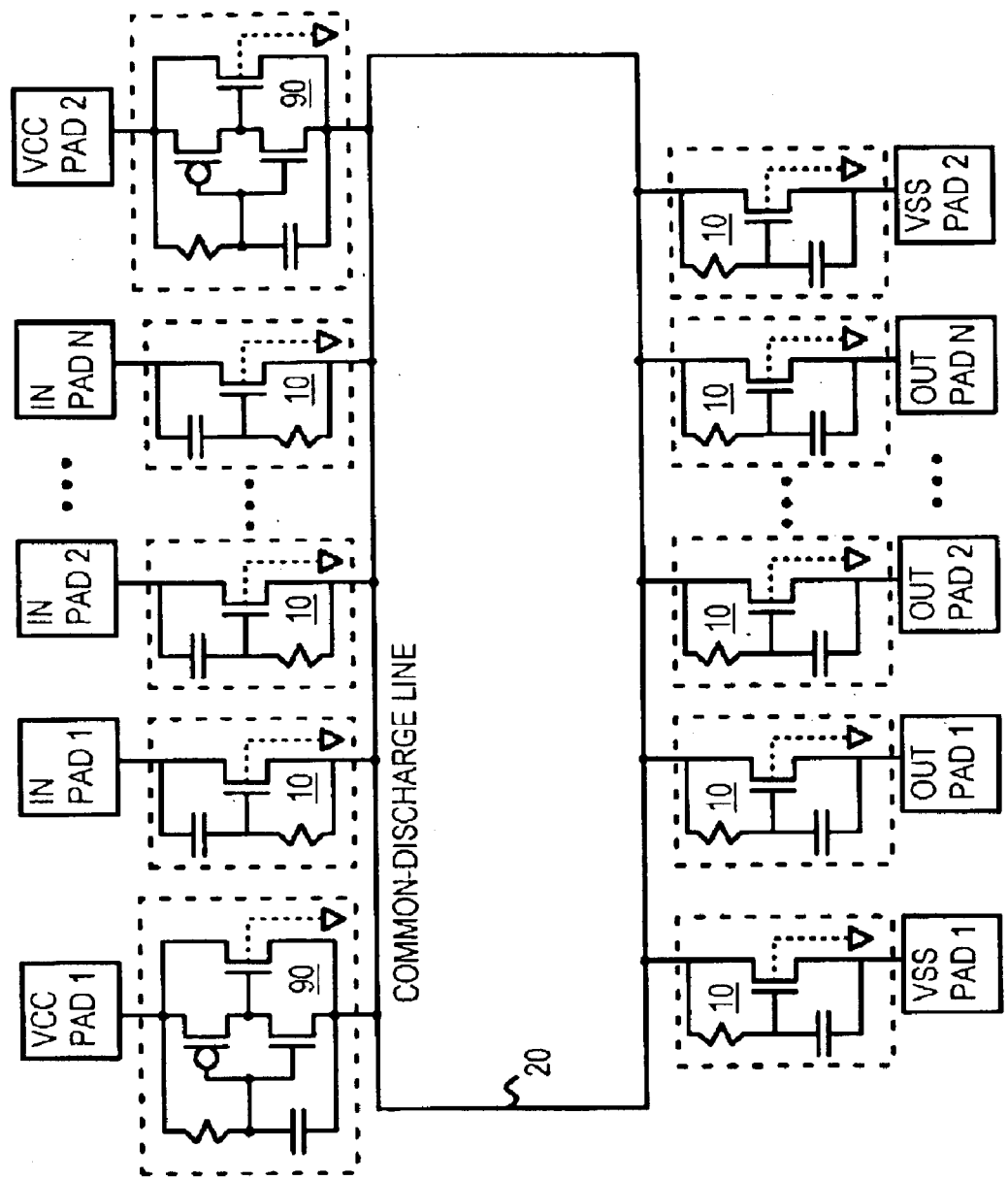
FIG. 8 is a diagram showing a CDL with active ESD clamps on the power pads.

FIG. 8 is a diagram showing a CDL with active ESD clamps on the power pads. CDL 20 connects ESD protection devices 10 for most pads, which are gate-coupled NMOS devices such as shown in FIG. 3.

However, VCC pad 1 and VCC pad 2 use active clamp 90 shown in FIG. 5. Active clamp 90 is also connected to CDL 20. Active clamp 90 turns on at a lower trigger voltage than ESD protection device 10, providing better protection for core transistors during power-to-ground ESD events.

Note that the coupling capacitor in active clamp 90 is between the n-channel gate and CDL 20, while the coupling capacitor in ESD protection device 10 is between the n-channel gate and the I/O pad. This is due to the inversion in active clamp 90. P-taps for n-channel transistors in active clamps 90 and ESD protection device 10 can be connected to local ground buses near the ESD devices to prevent noise coupling through CDL 20.

ALTERNATE EMBODIMENTS

Several other embodiments are contemplated by the inventors. Rather than use ESD protection device 10, some or all pads may use the substrate-triggered clamp, or the active clamp. Likewise, the power-to-ground ESD clamp 12 may be replaced with an active clamp or a substrate-trigger clamp. Additional devices may be added. The CDL may be segmented or a second CDL used.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label Intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electro-static-discharge (ESD) protected integrated circuit comprising:

first core circuitry connected between a first power bus connected to a first power pad and a first ground bus connected to a first ground pad;

second circuitry connected between a second power bus connected to a second power pad and a second ground bus connected to a second ground pad;

a common-discharge line that is not directly connected to power or ground;

a plurality of indirect ESD-protection devices coupled to the common-discharge line, each indirect ESD-protection device coupled to conduct ESD current between a pad and the common-discharge line; and a first direct ESD clamp between the first power bus and the first ground bus, for bypassing the common-discharge line and directly conducting ESD current from the first power bus to the first ground bus when an ESD pulse is applied between the first power pad and the first ground pad, whereby ESD current is conducted through two of the plurality of indirect ESD-protection devices and the common-discharge line, or bypassing the common-discharge line through the first direct ESD clamp.

2. The ESD protected integrated circuit of claim 1 wherein the plurality of indirect ESD-protection devices include gate-coupled ESD devices that each comprise:

a conducting transistor for conducting current between the pad and the common-discharge line in response to a transistor gate; and a coupling capacitor coupled between the pad and the transistor gate;

wherein the conducting transistor is activated to conduct ESD current from the pad to the common-discharge line when the coupling capacitor couples a portion of a voltage rise from the ESD pulse applied to the pad to the transistor gate.

3. The ESD protected integrated circuit of claim 2 wherein the conducting transistor is an n-channel transistor.

4. The ESD protected integrated circuit of claim 3 wherein the gate-coupled ESD devices each further comprise:

a local p-tap for connecting a p-well or p-substrate under the conducting transistor to a local ground, wherein the local p-tap is connected to the local ground and not to the common-discharge line to avoid noise coupling through the common-discharge line.

5. The ESD protected integrated circuit of claim 4 wherein the gate-coupled ESD devices each further comprise:

a discharge resistor between the transistor gate and the common-discharge line.

6. The ESD protected integrated circuit of claim 1 further comprising:

a second direct ESD clamp between the second power bus and the second ground bus, for bypassing the common-discharge line and directly conducting ESD current from the second power bus to the second ground bus when an ESD pulse is applied between the second power pad and the second ground pad.

7. The ESD protected integrated circuit of claim 6 wherein the first direct ESD clamp comprises:
a direct transistor coupled to conduct ESD current between the first power bus and the first ground bus in response to a direct-transistor gate;
a direct coupling capacitor coupled between the first power bus and the direct-transistor gate.

8. The ESD protected integrated circuit of claim 7 wherein the direct transistor is an n-channel transistor.

9. The ESD protected integrated circuit of claim 8 wherein the first direct ESD clamp further comprises:
a direct discharge resistor between the direct-transistor gate and the first ground bus.

10. The ESD protected integrated circuit of claim 2 wherein the plurality of indirect ESD-protection devices further comprises an active-clamp ESD device that comprises:
an active conducting transistor for conducting current between the pad and the common-discharge line in response to an active-transistor gate;
an active coupling capacitor coupled between the common-discharge line and an inverter gate node;
an inverter between the inverter gate node and the active-transistor gate.

11. The ESD protected integrated circuit of claim 10 wherein the active-clamp ESD device further comprises:
an active resistor between the inverter gate and the pad, for discharging the active coupling capacitor.

12. The ESD protected integrated circuit of claim 1 wherein the plurality of indirect ESD-protection devices further comprises a substrate-triggered ESD device that comprises:
an substrate-triggered transistor for conducting current between the pad and the common-discharge line in response to a substrate node;
a gate resistor coupled between a gate of the substrate-triggered transistor and the common-discharge line;
a substrate-coupling capacitor coupled between the pad and the substrate node;
a substrate-discharge resistor coupled between the substrate node and the common-discharge line.

13. An electro-static-discharge (ESD) protection circuit comprising:
a common-discharge line;
a plurality of external signal pads;
a first power pad and a second power pad;
a first ground pad and a second ground pad;
a first direct power-ground clamp that comprises:
a direct capacitor connected between the first power pad and a direct-gate node;
a direct n-channel transistor having a drain connected to the first power pad,
a source connected to the first ground pad, and a gate connected to the direct-gate node;
a direct resistor for discharging the direct capacitor, the direct resistor having a terminal connected to the direct-gate node;
a plurality of protection devices coupled between the plurality of external signal pads and the common-discharge line, wherein each protection device between a protected pad and the common-discharge line comprises:

a coupling capacitor connected between the protected pad and a coupled-gate node;
a conducting n-channel transistor having a drain connected to the protected pad, a source connected to the common-discharge line, and a gate connected to the coupled-gate node;
a discharge resistor for discharging the coupling capacitor, the discharge resistor having a terminal connected to the coupled-gate node.

14. The ESD protection circuit of claim 13 further comprising:
a second direct power-ground clamp that comprises:
a second direct capacitor connected between the second power pad and a second direct-gate node;
a second direct n-channel transistor having a drain connected to the second power pad, a source connected to the second ground pad, and a gate connected to the second direct-gate node;
a second direct resistor for discharging the second direct capacitor, the second direct resistor having a terminal connected to the second direct-gate node.

15. The ESD protection circuit of claim 14 wherein the conducting n-channel transistor in each protection device has a p-tap that connects a p-type substrate under the conducting n-channel transistor to a local ground that is isolated from the common-discharge line.

16. The ESD protection circuit of claim 15 wherein the direct resistor in each protection device has a second terminal connected to the common-discharge line,
whereby the direct resistor discharges to the common-discharge line.

17. An integrated circuit comprising:
common-discharge line means for discharging electro-static-discharges between pads of the integrated circuit;
a plurality of input/output I/O pads;
a first power pad and a second power pad;
a first ground pad and a second ground pad;
first active-clamp means, between the first power pad and the common-discharge line means, for conducting electro-static-discharges from the first power pad to the common-discharge line means;
second active-clamp means, between the second power pad and the common-discharge line means, for conducting electro-static-discharges from the second power pad to the common-discharge line means;
first gate-coupled device means, between a first I/O pad in the plurality of I/O pads and the common-discharge line means, for conducting electro-static-discharges from the first I/O pad to the common-discharge line means;
second gate-coupled device means, between a second I/O pad in the plurality of I/O pads and the common-discharge line means, for conducting electro-static-discharges from the second I/O pad to the common-discharge line means;
third gate-coupled device means, between a third I/O pad in the plurality of I/O pads and the common-discharge line means, for conducting electro-static-discharges from the third I/O pad to the common-discharge line means;
first ground gate-coupled device means, between the first ground pad and the common-discharge line means, for conducting electro-static-discharges between the first ground pad to the common-discharge line means:
second ground gate-coupled device means, between the second ground pad and the common-discharge line means, for conducting electro-static-discharges between the second ground pad to the common-discharge line means.

18. The integrated circuit of claim 17 wherein the first, second, and third gate-coupled device means each comprise a gate-coupled device between an I/O pad and the common-discharge line means that comprises:

capacitor means, between the I/O pad and a gate node, for charging the gate node when an electro-static-discharge is applied to the I/O pad;

transistor means, responsive to the gate node, for conducting the electro-static-discharge from the I/O pad to the common-discharge line means; discharge means, coupled to the gate node, for gradually discharging the capacitor means after the electro-static-discharge is conducted by the transistor means.

19. The integrated circuit of claim 18 wherein the first, second, and third gate-coupled device means each comprise the gate-coupled device between an I/O pad and the common-discharge line means that further comprises: p-tap means, coupled to a local ground, for grounding a substrate under the transistor means.

20. The integrated circuit of claim 19 wherein the first and second active-clamp means each comprise a clamp between a power pad and the common-discharge line means that comprises:

inverter means, between an inverter node and a active-gate node, for inverting a signal on the inverter node to drive the active-gate node;

active capacitor means, between the power pad and the active-gate node, for coupling the common-discharge line means to the inverter node when an electro-static-discharge is conducted to the common-discharge line means;

active transistor means, responsive to the active-gate node, for conducting the electro-static-discharge from the power pad to the common-discharge line means;

discharge means, coupled to the inverter node, for gradually discharging the active capacitor means after the electro-static-discharge is conducted by the active transistor means.

* * * * *